United States Patent
Chang et al.

(10) Patent No.: US 9,391,205 B2
(45) Date of Patent: Jul. 12, 2016

(54) GATE LAST SEMICONDUCTOR STRUCTURE AND METHOD FOR FORMING THE SAME

(71) Applicant: Taiwan Semiconductor Manufacturing Co., Ltd, Hsin-Chu (TW)

(72) Inventors: Che-Cheng Chang, New Taipei (TW); Chih-Han Lin, Hsinchu (TW); Jr-Jung Lin, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/517,272

(22) Filed: Oct. 17, 2014

(65) Prior Publication Data

US 2016/0111541 A1    Apr. 21, 2016

(51) Int. Cl.
| | |
|---|---|
| H01L 27/092 | (2006.01) |
| H01L 29/66 | (2006.01) |
| H01L 29/78 | (2006.01) |
| H01L 29/49 | (2006.01) |
| H01L 21/311 | (2006.01) |
| H01L 21/3213 | (2006.01) |

(52) U.S. Cl.
CPC ...... *H01L 29/7851* (2013.01); *H01L 21/31144* (2013.01); *H01L 21/32133* (2013.01); *H01L 29/495* (2013.01); *H01L 29/4966* (2013.01); *H01L 29/4975* (2013.01); *H01L 29/6681* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 2013/0161762 A1 | 6/2013 | Kelly et al. | |
| 2013/0187235 A1 | 7/2013 | Huang et al. | |
| 2014/0131776 A1 | 5/2014 | Ching et al. | |
| 2014/0256094 A1 | 9/2014 | Lin et al. | |
| 2014/0264445 A1* | 9/2014 | Xiao | H01L 29/7848 257/192 |
| 2015/0200271 A1* | 7/2015 | Lee | H01L 29/66545 257/401 |
| 2015/0318282 A1* | 11/2015 | Rodder | H01L 27/0886 257/392 |

* cited by examiner

*Primary Examiner* — Pamela E Perkins
(74) *Attorney, Agent, or Firm* — Birch, Stewart, Kolasch & Birch, LLP (57) ABSTRACT

A semiconductor structure and a method for forming the same are provided. The semiconductor structure includes a substrate and a metal gate structure formed over a fin structure of the substrate. The semiconductor structure further includes a spacer formed on a sidewall of the metal gate structure and a source/drain structure formed in the fin structure. In addition, the spacer is in direct contact with the fin structure.

20 Claims, 7 Drawing Sheets

GATE LAST SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink the dimensions of a chip.

As technology nodes shrink, in some integrated circuit (IC) designs, there has been a desire to replace the typically polysilicon gate with a metal gate to improve device performance with the decreased feature sizes. One process of forming the metal gate is called a "gate last" process. In a "gate last" process, the metal gate is fabricated last, which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
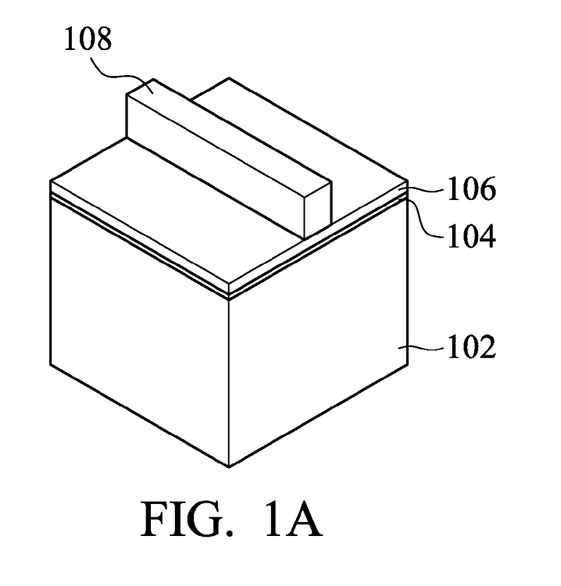
FIGS. 1A to 1N are cross-sectional representations of various stages of forming a semiconductor structure in accordance with some embodiments.

Embodiments of a semiconductor structure are provided in accordance with some embodiments of the disclosure. The semiconductor structure includes a metal gate structure formed by a gate last process. FIGS. 1A-1 to 1N are cross-sectional representations of various stages of forming a semiconductor structure 100 in accordance with some embodiments.

As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
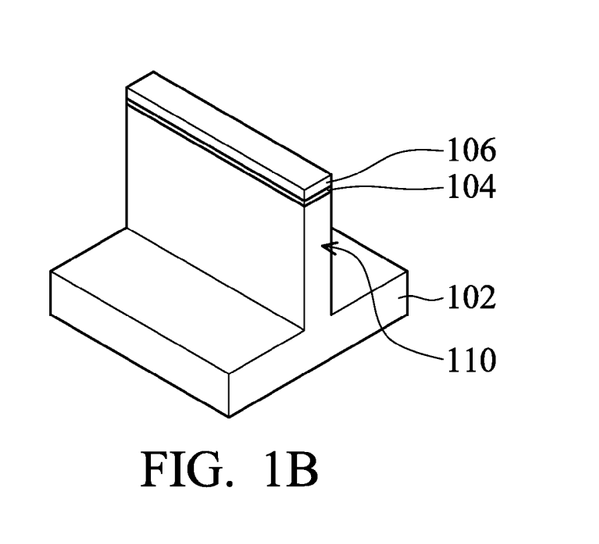

Next, fin structures 110 are formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

Figure 1C:
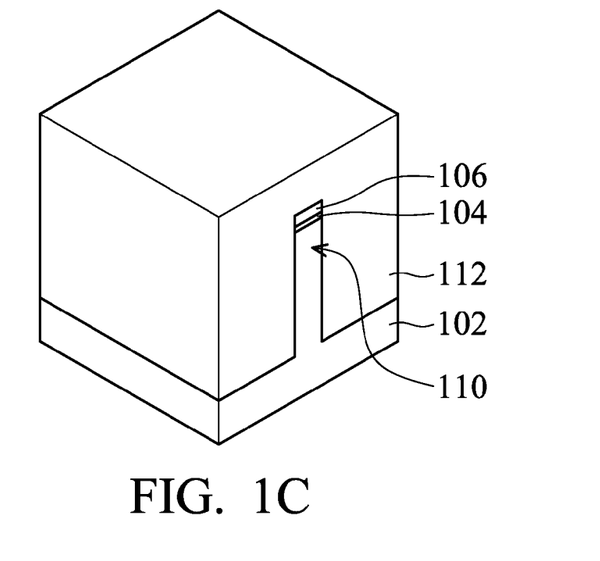

After photo-sensitive layer 108 is removed, an insulating layer 112 is formed to cover fin structures 110 over substrate 102, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Figure 1D:
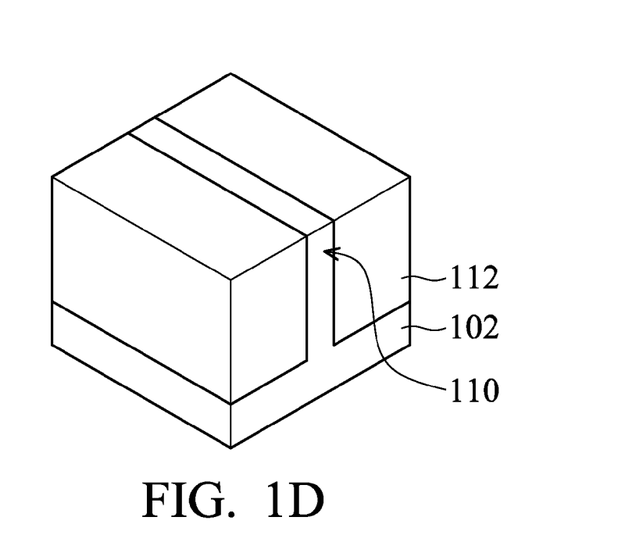

After insulating layer 112 is formed, a chemical mechanical polishing (CMP) process is performed to expose the top surfaces of fin structures 110, as shown in FIG. 1D in accordance with some embodiments. As shown in FIG. 1D, mask layer 106 and dielectric layer 104 are removed.

Figure 1E:
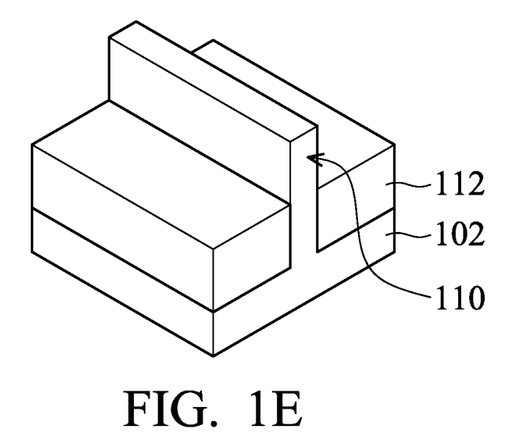

Next, insulating layer 112 is recessed to expose the top portion of fin structures 110, as shown in FIG. 1E in accordance with some embodiments. Insulating layer 112 may be recessed by a wet etching process or a dry etching process. Insulating layer 112 may be seen as shallow trench isolation (STI) structures.

Figure 1F:
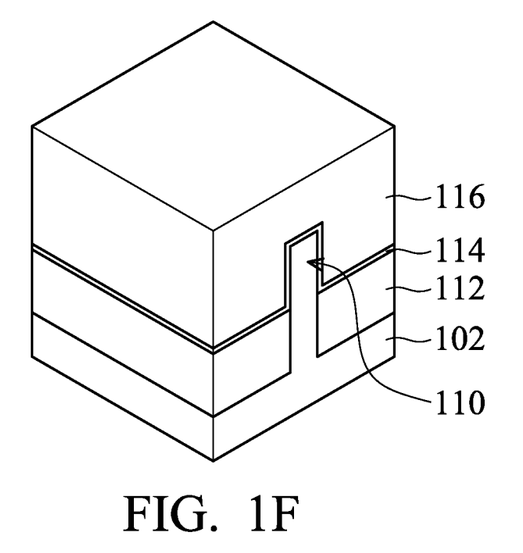

Afterwards, a gate dielectric layer 114 is formed over substrate 102 to cover fin structure 110 and insulating layer 112, as shown in FIG. 1F in accordance with some embodiments. In some embodiments, gate dielectric layer 114 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, gate dielectric layer 114 is an oxide layer.

Gate dielectric layer 114 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

After gate dielectric layer 114 is formed, a sacrificial layer 116 is formed over gate dielectric layer 114, as shown in FIG. 1F in accordance with some embodiments. Sacrificial layer 116 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). Sacrificial layer 116 may be made of conductive or non-conductive materials, such as metals, silicon containing materials, or dielectric materials. In some embodiments, sacrificial layer 116 is made of polysilicon.

Figure 1G:
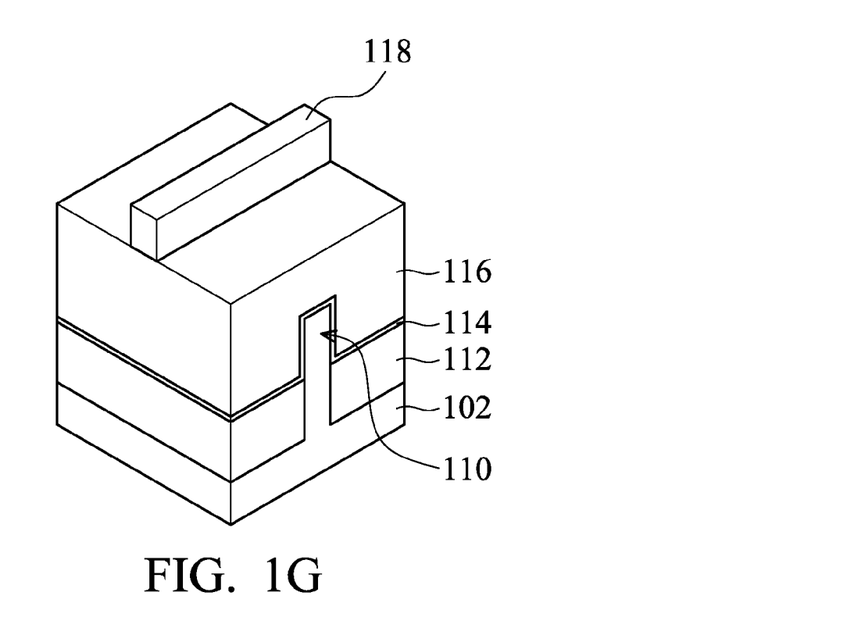

Next, sacrificial layer 116 and gate dielectric layer 114 are patterned to form a dummy gate structure 120 in accordance with some embodiments. More specifically, a mask structure 118 is formed over a portion of sacrificial layer 116, as shown in FIG. 1G in accordance with some embodiments. Mask structure 118 may be seen as a hard mask for protecting sacrificial layer 116 and gate dielectric layer 114 formed underneath during subsequent photolithography processes.

Mask structure 118 may be formed by a procedure including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 1H:
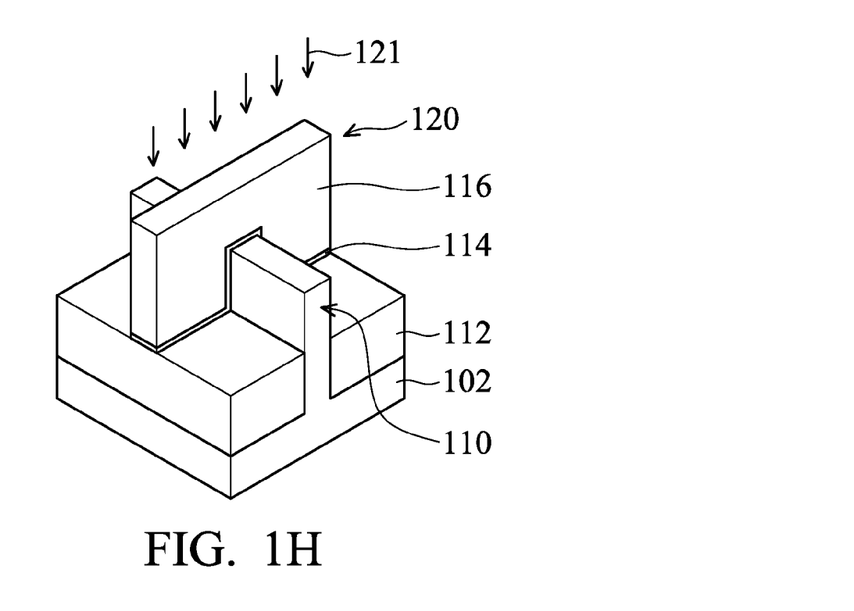

After mask structure 118 is formed, an etching process 121 is performed to form dummy gate structure 120, and mask structure 118 is removed after etching process 121, as shown in FIG. 1H in accordance with some embodiments. Dummy gate structure 120 includes the portions of sacrificial layer 116 and gate dielectric layer 114 positioned below mask structure 118. Sacrificial layer 116 may be seen as a dummy gate electrode layer in dummy gate structure 120, and gate dielectric layer 114 may be seen as a dummy gate dielectric layer in dummy gate structure 120. By performing etching process 121, the portions of sacrificial layer 116 and gate dielectric layer 114 not covered by mask structure 118 are removed. As shown in FIG. 1H, after etching process 121, fin structure 110 is not covered by gate dielectric layer 114 except for the portion that is covered by dummy gate structure 120.

Figure 1I:
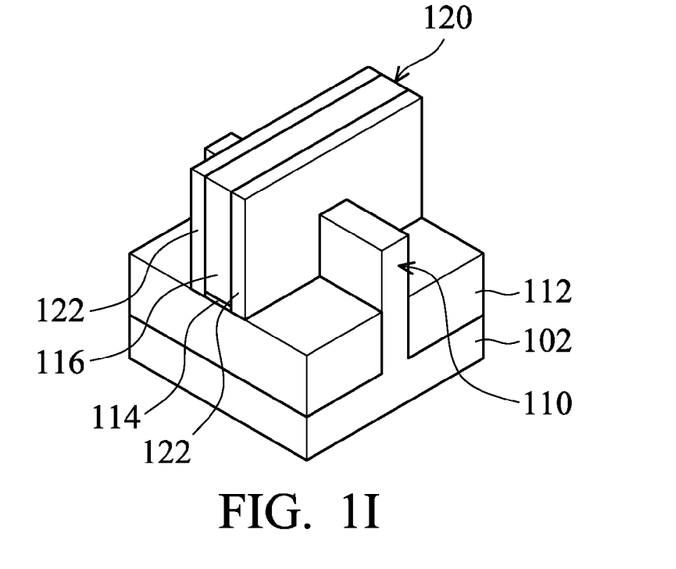

After dummy gate structure 120 is formed, spacers 122 are formed on the sidewalls of dummy gate structure 120, as shown in FIG. 1I in accordance with some embodiments. In some embodiments, spacers 122 are made of silicon nitride, silicon carbide, silicon oxynitride, silicon carbon, silicon oxide, silicon hydrogen, other applicable materials, or a combination thereof. In some embodiments, spacers 122 are made of nitride. Spacers 122 may be formed by deposition and etching processes.

As described previously, the portions of gate dielectric layer 114 formed over fin structure 110 and insulating layer 112 not covered by mask structure 118 are completely removed by etching process 121 in accordance with some embodiments. Therefore, when spacers 122 are formed on fin structure 110 and insulating layer 112 at the sidewall of dummy gate structure 120, spacers 122 are in direct contact with fin structure 110 and insulating layer 112 in accordance with some embodiments. That is, spacers 122 and fin structure 110 are not separated by gate dielectric layer 114.

Figure 1J:
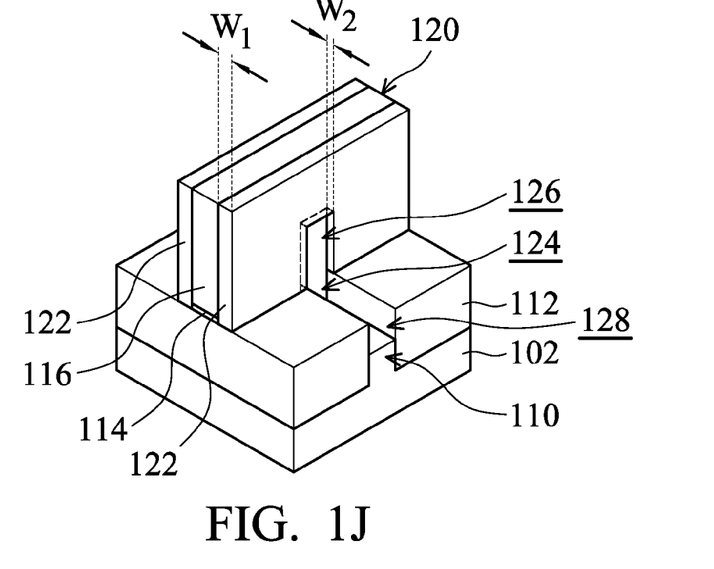

Next, recesses 124 are formed in fin structure 110, as shown in FIG. 1J in accordance with some embodiments. In some embodiments, each recess 124 includes an extending portion 126 and a main portion 128. Extending portion 126 of recess 124 is formed by recessing the portion of fin structure 110 under spacer 122, and main portion 128 of recess 124 is formed by recessing the portion of fin structure 110 adjacent to spacer 122.

In some embodiments, spacer 122 has a width $W_1$, and extending portion 126 of recess 124 has a width $W_2$ smaller than width $W_1$. In some embodiments, width $W_1$ of spacer 122 is in a range from about 30 Å to about 300 Å. In some embodiments, width $W_2$ of extending portion 126 of recess 124 is in a range from about 10 Å to about 30 Å. In some embodiments, the ratio of width $W_1$ to width $W_2$ is in a range from about 1:1 to about 30:1.

Figure 1K:
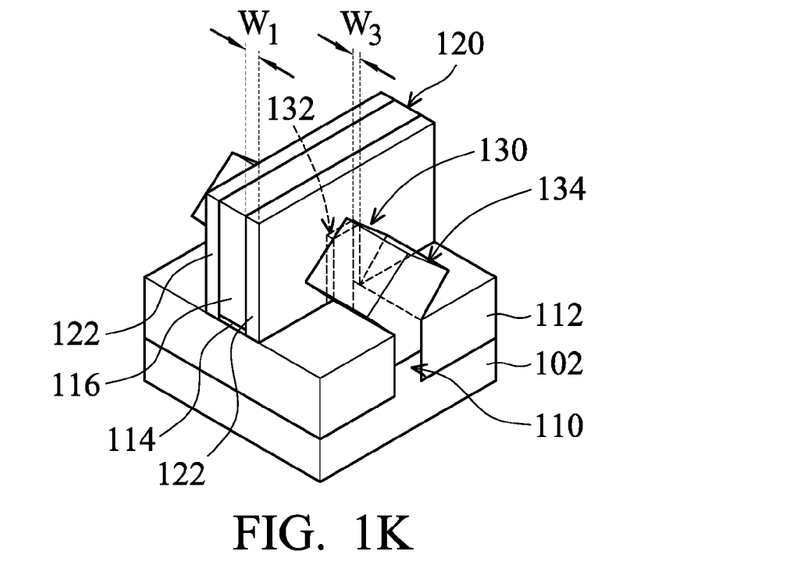

After recesses 124 are formed in fin structure 110, source/drain (S/D) structures 130 are formed in recesses 124, as shown in FIG. 1K in accordance with some embodiments. In some embodiments, source/drain structures 130 are strained source/drain structures. In some embodiments, source/drain structures 130 are formed by growing a strained material in recesses 124 of fin structure 110 by an epitaxial (epi) process. In addition, the lattice constant of the strained material may be different from the lattice constant of substrate 102. In some embodiments, source/drain structures 130 include Ge, SiGe, InAs, InGaAs, InSb, GaAs, GaSb, InAlP, InP, or a combination thereof.

As described previously, each recess 124 includes extending portion 126 and main portion 128, and therefore each source/drain structure 130 also includes an extending portion 132 and an main portion 134 in accordance with some embodiments. In some embodiments, extending portion 132 of source/drain structure 130 is formed in extending portion 126 of recess 124, and main portion 134 of source/drain structure 130 is formed in main portion 128 of recess 124. In addition, extending portion 132 of source/drain structure 130 is formed under spacer 122.

In some embodiments, extending portion 132 of source/drain structure 130 has a width $W_3$ substantially equal to width $W_2$ of extending portion 126 of recess 124. In some embodiments, a ratio of width $W_1$ to width $W_3$ is in a range from about 1:1 to about 30:1. It should be noted that, although extending portion 132 of source/drain structure 130 shown in FIG. 1K is a rectangular cuboid, the shape of the extending portion is not intended to be limiting. For example, the extending portion of the source/drain structure may have rounded edges.

Figure 1L:
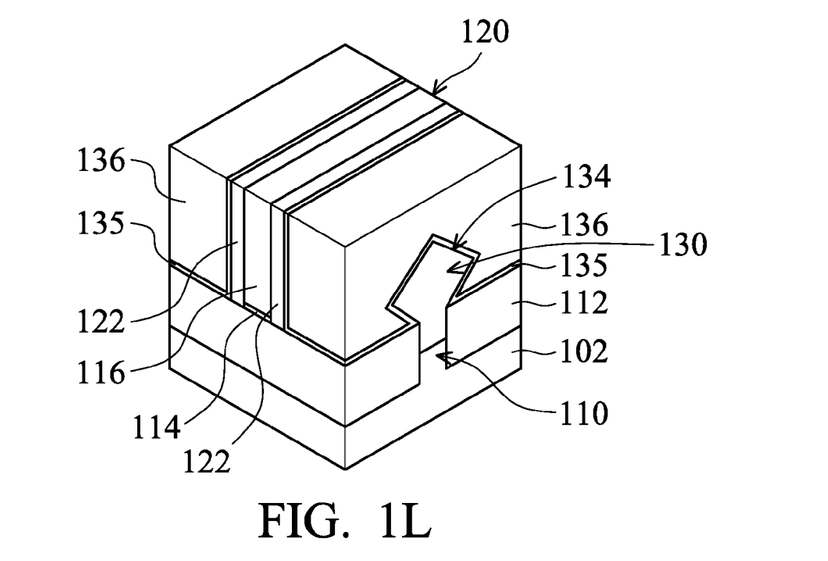

After source/drain structures 130 are formed, a contact etch stop layer (CESL) 135 is formed to cover dummy gate structure 120 over substrate 102, as shown in FIG. 1L in accordance with some embodiments. In some embodiments, contact etch stop layer 135 is made of silicon nitride, silicon oxynitride, and/or other applicable materials. Contact etch stop layer 135 may be formed by plasma enhanced CVD, low pressure CVD, ALD, or other applicable processes.

Afterwards, an inter-layer dielectric (ILD) layer 136 is formed over contact etch stop layer 135 over substrate 102 in accordance with some embodiments. Inter-layer dielectric layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Afterwards, a polishing process is performed to inter-layer dielectric layer 136, as shown in FIG. 1L in accordance with some embodiments. In some embodiments, inter-layer dielectric layer 136 is planarized by a chemical mechanical polishing (CMP) process until the top surface of dummy gate structure 120 is exposed.

Figure 1M:
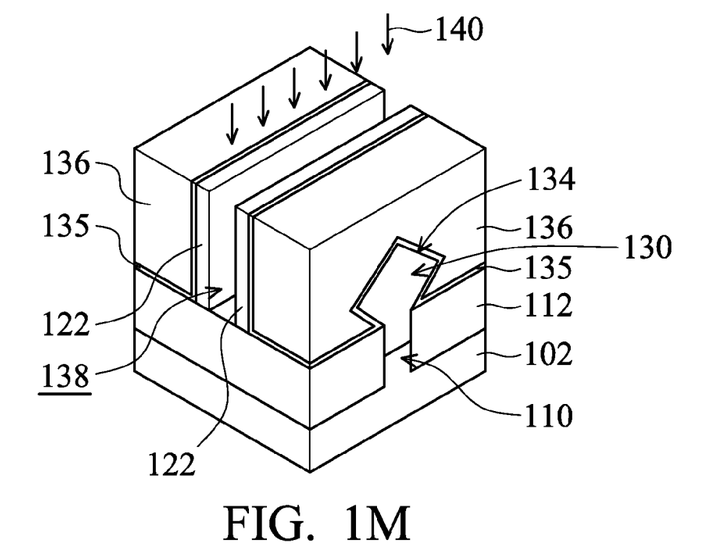
Figure 1N:
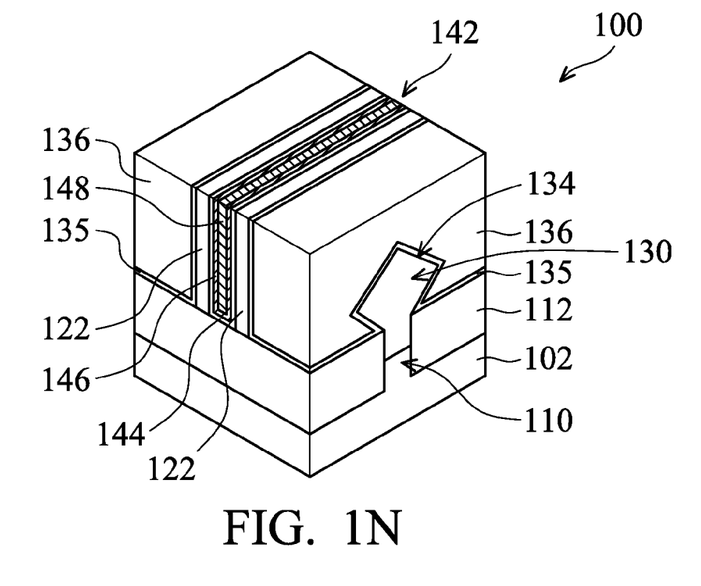

After the polishing process is performed, dummy gate structure 120 is replaced by a metal gate structure in accordance with some embodiments. More specifically, dummy gate structure 120 is removed to form a trench 138, as shown in FIG. 1M in accordance with some embodiments. In some embodiments, dummy gate structure 120 is removed by performing a first etching process (not shown) and performing a second etching process after the first etching process. In some embodiments, sacrificial layer 116 of dummy gate structure 120 is mainly removed by the first etching process, and gate dielectric layer 114 is mainly removed by the second etching process. In some embodiments, the first etching process is a dry etching process and the second etching process is a wet etching process 140, as shown in FIG. 1M. In some embodiments, the dry etching process includes using an ethcin gas such as $CF_4$, Ar, $NF_3$, $Cl_2$, He, HBr, $O_2$, $N_2$, $CH_3F$, $CH_4$, $CH_2F_2$, or a combination thereof. In some embodiments, the dry etching process is performed at a temperature in a range from about 20° C. to about 80° C. In some embodiments, the dry etching process is performed at a pressure in a range from about 1 mtorr to about 100 mtorr. In some embodiments, the dry etching process is performed at a power in a range from about 50 W to about 1500 W.

Wet etching process 140 may be used to fully remove gate dielectric layer 114, such that the metal gate formed afterwards can be directly formed on fin structure 110 and insulating layer 112. In some embodiments, wet etching process 140 includes using HF and $NH_4OH$. In some embodiments, wet etching process 140 is performed at a temperature in a range from about 30° C. to about 200° C. In some embodiments, wet etching process 140 is performed for a time in a range from about 20 seconds to about 400 seconds.

Wet etching process 140 may be performed for a relatively long time (e.g. an over-etching process) to completely remove gate dielectric layer 114 in dummy gate structure 120, such that the metal gate structure formed afterwards can have a better performance. However, when wet etching process 140 is an over-etching process, if there is some portion of gate dielectric layer 114 left below spacers 122, the portion of gate dielectric layer 114 may also be removed during wet etching process 140, resulting in forming voids or paths between spacers 122 and fin structure 110.

Therefore, as described previously, other portions of gate dielectric layer 114 not covered by mask structure 118 during etching process 121 are removed beforehand, and spacers 122 are formed directly on fin structure 110. That is, no gate dielectric layer 114 is positioned between spacers 122 and fin structure 110. Therefore, even if wet etching process 140 is performed for a relatively long time to completely removed gate dielectric layer 114, spacers 122 can stop the etching solution used in wet etching process 140 from further damaging the structure. Accordingly, gate dielectric layer 114 can be fully removed by wet etching process 140 without the etching solution used in wet etching process 140 further leaking through spacers 122.

After dummy gate structure 120 is removed, a metal gate structure 142 is formed in trench 138, as shown in FIG. 1N in accordance with some embodiments. As shown in FIG. 1N, metal gate structure 142 is formed across fin structures 110 and extends over insulating layer 112. In some embodiments, metal gate structure 142 includes a high-k dielectric layer 144, a work function layer 146, and a metal gate electrode layer 148.

In some embodiments, high-k dielectric layer 144 is made of metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, work function layer 146 is formed over high-k dielectric layer 144. The work function metal layer may be tuned to have a proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, metal gate electrode layer 148 is formed over work function layer 146. In some embodiments, metal gate electrode layer 148 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

As described previously, not all of the gate dielectric layer 114 formed underneath sacrificial layer 116 is removed at the same time. More specifically, some portions of gate dielectric layer 114 is removed first, and other portions of gate dielectric layer 114 is removed later.

As shown in FIG. 1H, portions of gate dielectric layer 114 which are not covered by mask structure 118 are removed by etching process 121. That is, most of the gate dielectric layer 114 is removed except form that used to form dummy gate structure 120. After the portions of gate dielectric layer 114 not covered by mask structure 118 are removed, spacers 122 are formed across fin structure 110 over substrate 102. Accordingly, spacers 122 are formed directly over fin structure 110 without further separation by gate dielectric layer 114.

As shown in FIG. 1M, the remaining portion of gate dielectric layer 114 (i.e. the portion of gate dielectric layer 114 covered by mask structure 118 during etching process 121) is removed during the removal of dummy gate structure 120 (e.g. by wet etching process 140). In order to fully remove gate dielectric layer 114, wet etching process 140 may be performed for a relatively long time. Therefore, if the other portion of gate dielectric layer 114 is not removed in the previous step, e.g. if the portion of gate dielectric layer 114 not covered by mask structure 118 is not removed beforehand and is left under spacers 122, the gate dielectric layer 114 under spacers 122 may also be etched and removed during wet etching process 140. In this case, voids or paths may be formed between spacers 122 and fin structure 110, and the materials used to form metal gate structure 142 may further be filled in these voids or paths, resulting in extrusion of metal gate structure 142.

In addition, as shown in FIG. 1K, source/drain structures 130 may have extending portion 132 extending under spacers 122. Therefore, if the materials used to form metal gate structure 142 fill in the voids or paths formed between spacers 122 and fin structure 110, the extrusion of metal gate structure 142 may be very close to extending portion 132 of source/drain structure 134. As a result, shortage circuit may occur and the yield of forming the semiconductor structure may be reduced.

Accordingly, in some embodiments of the disclosure, the portions of gate dielectric layer 114 which are not included in dummy gate structure 120 are removed first, such that there will be no gate dielectric layer left between spacers 122 and fin structure 110. Therefore, during the etching process used to removed dummy gate structure 120 (e.g. wet etching process 140), the etching solution will be stopped by spacers 122, and voids or paths will not be formed between spacers 122 and fin structure 110. Accordingly, the formation of extrusion of metal gate structure 142 formed afterwards may be prevented. Therefore, even if source/drain structures 130 have extending portion 132 formed under spacers 122, the resulting metal gate structure 142 can still be separated from extending portion 132 of source/drain structures 130 by spacers 122.

In addition, since spacers 122 are formed directly on fin structure 110 without gate dielectric layer 114 formed therebetween, the etching process used to remove dummy gate structure (e.g. wet etching process 140) may be performed for a relatively long time. Therefore, gate dielectric layer 114 can be completely removed and metal gate structure 142 formed afterwards can perform better. That is, the formation of metal gate structure 142 can have a larger process window and the yield of forming semiconductor structure 100 is improved.

Embodiments for forming a semiconductor structure are provided. The semiconductor structure is formed in a gate-last process. The method for forming the semiconductor structure includes forming a gate dielectric layer over a substrate to cover a fin structure of the substrate and a sacrificial layer over the gate dielectric layer. The gate dielectric layer and the sacrificial layer is patterned to form a dummy gate structure, and spacers are formed on the sidewalls of the dummy gate structure. In addition, when the dummy gate structure is formed, the gate dielectric layer not included in the dummy gate structure is removed, and therefore the spacers is directly formed on the fin structure. Therefore, in the subsequent etching process which is used to remove the dummy gate structure, the spacers can be used to stop the etching solution from forming voids or paths. Accordingly, the gate dielectric layer can be completely removed and a metal gate formed afterwards can have a larger process window. Therefore, the yield of forming the semiconductor structure is improved.

In some embodiments, a semiconductor structure is provided. The semiconductor structure includes a substrate and a metal gate structure formed over a fin structure of the substrate. The semiconductor structure further includes a spacer formed on a sidewall of the metal gate structure and a source/drain structure formed in the fin structure. In addition, the spacer is in direct contact with the fin structure.

In some embodiments, a semiconductor structure is provided. The semiconductor structure includes a substrate and a metal gate structure formed across a fin structure of the substrate. The semiconductor structure further includes a spacer formed on a sidewall of the metal gate structure across the fin structure. In addition, the spacer is in direct contact with the fin structure. The semiconductor structure further includes a source/drain structure formed in the fin structure. In addition, the source/drain structure has an extending portion extending under the spacer.

In some embodiments, a method for forming a semiconductor structure is provided. The method for forming the semiconductor structure includes forming a gate dielectric layer over a substrate to cover a fin structure of the substrate and forming a sacrificial layer over the gate dielectric layer. The method for forming the semiconductor structure further includes patterning the sacrificial layer and the gate dielectric layer to form a dummy gate structure over the fin structure. The method for forming the semiconductor structure further includes forming a spacer on a sidewall of the dummy gate structure and forming a recess in the fin structure. The method for forming the semiconductor structure further includes forming a source/strain structure in the recess and replacing the dummy gate structure with a metal gate structure. In addition, the spacer is in direct contact with the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;

a metal gate structure formed over a fin structure of the substrate;

a spacer formed on a sidewall of the metal gate structure; and a source/drain structure formed in the fin structure, wherein the source/drain structure has an extending portion extending into a recess of the spacer.

2. The semiconductor structure as claimed in claim 1, wherein the spacer has a first width and the extending portion of the source/drain structure has a second width smaller than the first width.

3. The semiconductor structure as claimed in claim 1, wherein the spacer has a first width and the extending portion of the source/drain structure has a second width, and a ratio of the first width to the second width is in a range from 1:1 to about 30:1.

4. The semiconductor structure as claimed in claim 1, wherein the spacer is made of silicon nitride, silicon carbide, silicon oxynitride, silicon carbon, silicon oxide, silicon hydrogen, or a combination thereof.

5. The semiconductor structure as claimed in claim 1, wherein the source/drain structure is a strained source/drain structure.

6. The semiconductor structure as claimed in claim 1, wherein the metal gate structure comprises a high-k dielectric layer, a work function layer, and metal gate electrode layer.

7. The semiconductor structure as claimed in claim 1, wherein the spacer is in direct contact with the fin structure.

8. A semiconductor structure, comprising:

a substrate;

a gate structure formed over the substrate;

a spacer formed on a sidewall of the gate structure;

a source/drain structure formed in the structure, wherein the source/drain structure has an extending portion extending into a recess of the spacer.

9. The semiconductor structure as claimed in claim 8, wherein the extending portion of the source/drain structure extends directly under the spacer.

10. The semiconductor structure as claimed in claim 8, wherein the spacer has a first width and the extending portion of the source/drain structure has a second width smaller than the first width.

11. The semiconductor structure as claimed in claim 8, wherein the spacer has a first width and the extending portion of the source/drain structure has a second width, and a ratio of the first width to the second width is in a range from 1:1 to about 30:1.

12. The semiconductor structure as claimed in claim 8, wherein the spacer is made of silicon nitride, silicon carbide, silicon oxynitride, silcon carbon, silicon oxide, silicon hydrogen, or a combination thereof.

13. The semiconductor structure as claimed in claim 8, wherein the source/drain structure is a strained source/drain structure.

14. A semiconductor structure, comprising:

a substrate;

a gate structure formed across a fin structure over the substrate;

a spacer formed on a sidewall of the gate structure and directly contacting the fin structure; and a source/drain structure formed in the fin structure, wherein the source/drain structure has an extending portion extending under the spacer into a recess of the spacer.

15. The semiconductor structure as claimed in claim 14, wherein the gate structure and the extending portion of the source/drain structure are separated from each other.

16. The semiconductor structure as claimed in claim 14, wherein the gate structure and the extending portion of the source/drain structure are separated by the spacer.

17. The semiconductor structure as claimed in claim 14, wherein the extending portion of the source/drain structure has a width in a range from about 10 Å to about 30 Å.

18. The semiconductor structure as claimed in claim 14, wherein the spacer and the fin structure are not separated by a high dielectric material.

19. The semiconductor structure as claimed in claim 14, wherein the spacer is made of silicon nitride, silicon carbide, silicon oxynitride, silcon carbon, silicon oxide, or a combination thereof.

20. The semiconductor structure as claimed in claim 14, wherein the spacer is made of nitride.

* * * * *